US011081346B2

(12) United States Patent
Charles

(10) Patent No.: US 11,081,346 B2
(45) Date of Patent: Aug. 3, 2021

(54) SEMICONDUCTOR STRUCTURE HAVING A GROUP III-V SEMICONDUCTOR LAYER COMPRISING A HEXAGONAL MESH CRYSTALLINE STRUCTURE

(71) Applicant: COMMISSARIAT A L'ENERGIE ATOMIQUE ET AUX ENERGIES ALTERNATIVES, Paris (FR)

(72) Inventor: Matthew Charles, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/527,466

(22) PCT Filed: Nov. 17, 2015

(86) PCT No.: PCT/EP2015/076816
§ 371 (c)(1),
(2) Date: May 17, 2017

(87) PCT Pub. No.: WO2016/079115
PCT Pub. Date: May 16, 2016

(65) Prior Publication Data
US 2018/0012757 A1 Jan. 11, 2018

(30) Foreign Application Priority Data
Nov. 18, 2014 (FR) ........................... 1461109

(51) Int. Cl.
*H01L 29/06* (2006.01)
*H01L 21/02* (2006.01)
(Continued)

(52) U.S. Cl.
CPC .... *H01L 21/02507* (2013.01); *H01L 21/0251* (2013.01); *H01L 21/0254* (2013.01);
(Continued)

(58) Field of Classification Search
CPC ......... H01L 21/02381; H01L 21/02458; H01L 21/02463; H01L 21/02507;
(Continued)

(56) References Cited

U.S. PATENT DOCUMENTS 6,388,275 B1 * 5/2002 Kano ..................... B82Y 20/00
257/94
6,535,536 B2 * 3/2003 Fukunaga ........... H01S 5/32341
372/45.01
(Continued)

FOREIGN PATENT DOCUMENTS

EP 0 332 329 A2 9/1989
EP 2 565 907 A1 3/2013

OTHER PUBLICATIONS

Park et al., "Enhanced overall efficiency of GaInN-based light-emitting diodes with reduced efficiency droop by Al-composition-graded AlGaN/GaN superlattice electron blocking layer", Applied Physics Letters 103 (2013) Jun. 11, 2004.*

(Continued)

*Primary Examiner* — Jay C Kim
(74) *Attorney, Agent, or Firm* — Oblon, McClelland, Maier & Neustadt, L.L.P.

(57) ABSTRACT

A semiconductor structure (100) comprising:
a substrate (102),
a first layer (106) of $Al_xGa_yIn_{(1-x-y)}N$ disposed on the substrate,
stacks (107, 109) of several second and third layers (108, 110) alternating against each other, between the substrate and the first layer,
a fourth layer (112) of $Al_xGa_yIn_{(1-x-y)}N$, between the stacks,
a relaxation layer of AlN disposed between the fourth layer and one of the stacks, and, in each of the stacks:
(Continued)

the level of Ga of the second layers increases from one layer to the next in a direction from the substrate to the first layer, the level of Ga of the third layers is constant or decreasing from one layer to the next in said direction, the average mesh parameter of each group of adjacent second and third layers increasing from one group to the next in said direction, the thickness of the second and third layers is less than 5 nm.

14 Claims, 5 Drawing Sheets

(51) Int. Cl.
| | |
|---|---|
| H01L 33/06 | (2010.01) |
| H01L 33/32 | (2010.01) |
| H01L 33/12 | (2010.01) |
| H01L 29/10 | (2006.01) |
| H01L 29/778 | (2006.01) |
| H01L 23/00 | (2006.01) |
| H01L 29/15 | (2006.01) |
| H01L 29/20 | (2006.01) |
| H01L 33/30 | (2010.01) |
| H01L 29/207 | (2006.01) |

(52) U.S. Cl.
CPC .. *H01L 21/02381* (2013.01); *H01L 21/02458* (2013.01); *H01L 21/02463* (2013.01); *H01L 21/02546* (2013.01); *H01L 21/02551* (2013.01); *H01L 23/562* (2013.01); *H01L 29/1075* (2013.01); *H01L 29/155* (2013.01); *H01L 29/20* (2013.01); *H01L 29/2003* (2013.01); *H01L 29/7785* (2013.01); *H01L 29/7786* (2013.01); *H01L 33/06* (2013.01); *H01L 33/12* (2013.01); *H01L 33/30* (2013.01); *H01L 33/32* (2013.01); *H01L 29/207* (2013.01)

(58) Field of Classification Search
CPC ............. H01L 21/02546; H01L 23/562; H01L 29/155; H01L 29/20; H01L 29/2003; H01L 29/7785; H01L 33/06; H01L 33/12; H01L 33/30; H01L 33/32

See application file for complete search history.

(56) References Cited

U.S. PATENT DOCUMENTS

| | | | | |
|---|---|---|---|---|
| 6,803,597 B2* | 10/2004 | Watatani | ................ | B82Y 20/00 257/13 |
| 6,841,809 B2* | 1/2005 | Fareed | ............. | H01L 29/66462 257/183 |
| 7,084,420 B2* | 8/2006 | Kim | ................ | B82Y 20/00 257/13 |
| 7,518,154 B2* | 4/2009 | Otsuka | ............. | H01L 29/66462 257/103 |
| 7,652,282 B2* | 1/2010 | Yanagihara | ....... | H01L 21/02381 257/19 |
| 7,705,364 B2* | 4/2010 | Lee | ................ | B82Y 20/00 257/104 |
| 7,893,424 B2* | 2/2011 | Eichler | .............. | H01S 5/34333 257/13 |
| 7,902,544 B2* | 3/2011 | Kim | ................ | B82Y 20/00 257/103 |
| 7,994,539 B2* | 8/2011 | Nam | ................ | H01L 21/0242 257/190 |
| 8,022,392 B2* | 9/2011 | Eichler | ................ | B82Y 20/00 257/103 |
| 8,067,787 B2* | 11/2011 | Kokawa | ................ | H01L 29/045 257/103 |
| 8,093,606 B2* | 1/2012 | Sonobe | ................ | B82Y 20/00 257/103 |
| 8,093,625 B2* | 1/2012 | Shim | ................ | H01L 33/007 257/103 |
| 8,212,288 B2* | 7/2012 | Komiyama | ....... | H01L 21/02458 257/183 |
| 8,264,001 B2* | 9/2012 | Sato | ................ | H01L 21/02381 257/190 |
| 8,405,064 B2* | 3/2013 | Yamaguchi | ....... | H01L 21/02381 257/12 |
| 8,426,844 B2* | 4/2013 | Moon | ................ | H01L 33/04 257/14 |
| 8,530,935 B2* | 9/2013 | Yanagihara | .......... | H01L 29/7787 257/190 |
| 8,742,396 B2* | 6/2014 | Ooshika | ................ | H01L 29/15 257/15 |
| 8,748,866 B2* | 6/2014 | Lee | ................ | H01L 33/06 257/13 |
| 8,853,666 B2* | 10/2014 | Inoue | ................ | H01L 29/155 257/12 |
| 8,981,382 B2* | 3/2015 | Gao | ................ | H01L 29/2003 257/76 |
| 8,987,757 B2* | 3/2015 | Moon | ................ | H01L 33/06 257/76 |
| 9,090,993 B2* | 7/2015 | Miyoshi | ................ | C30B 25/18 |
| 9,136,430 B2* | 9/2015 | Tak | ................ | H01L 21/02381 |
| 9,166,100 B2* | 10/2015 | Han | ................ | H01L 33/06 |
| 9,166,102 B2* | 10/2015 | Okuno | ................ | H01L 33/04 |
| 9,324,907 B2* | 4/2016 | Yeh | ................ | H01L 33/06 |
| 9,722,139 B2* | 8/2017 | Sun | ................ | H01L 33/06 |
| 2002/0074552 A1 | 6/2002 | Weeks, Jr. et al. | | |
| 2002/0171092 A1 | 11/2002 | Goetz et al. | | |
| 2003/0057434 A1* | 3/2003 | Hata | ................ | B82Y 20/00 257/103 |
| 2004/0119063 A1* | 6/2004 | Guo | ................ | C30B 29/68 257/13 |
| 2005/0118752 A1* | 6/2005 | Otsuka | ................ | C30B 25/02 438/172 |
| 2006/0068601 A1* | 3/2006 | Lee | ................ | H01L 21/02381 438/761 |
| 2007/0045655 A1* | 3/2007 | Song | ................ | H01L 33/04 257/104 |
| 2008/0203382 A1 | 8/2008 | Yanagihara | | |
| 2010/0244096 A1 | 9/2010 | Sato | | |
| 2012/0223328 A1 | 9/2012 | Ikuta et al. | | |
| 2013/0043488 A1 | 2/2013 | Miyoshi et al. | | |
| 2014/0209862 A1 | 7/2014 | Ikuta et al. | | |
| 2014/0264379 A1 | 9/2014 | Kub et al. | | |
| 2014/0264380 A1 | 9/2014 | Kub et al. | | |
| 2015/0221647 A1 | 8/2015 | Kub et al. | | |
| 2015/0221649 A1 | 8/2015 | Kub et al. | | |
| 2015/0221727 A1 | 8/2015 | Kub et al. | | |
| 2015/0221760 A1 | 8/2015 | Kub et al. | | |

OTHER PUBLICATIONS

International Search Report dated Feb. 1, 2016 in PCT/EP2015/076816 filed Nov. 17, 2015.

French Search Report dated Aug. 27, 2015 in FR 1461109 filed Nov. 18, 2014.

Extended European Search Report dated Apr. 17, 2018 in European Patent Application No. 18152694.8 (with English translation of Category of Cited Documents), 8 pages.

\* cited by examiner

SEMICONDUCTOR STRUCTURE HAVING A GROUP III-V SEMICONDUCTOR LAYER COMPRISING A HEXAGONAL MESH CRYSTALLINE STRUCTURE

TECHNICAL DOMAIN AND PRIOR ART

This description applies to a semiconductor structure comprising a group III-V or II-VI semiconductor layer with a cubic or hexagonal crystal lattice structure comprising a lattice parameter or crystalline parameter, different from that of the material of the substrate on which this layer if formed, and a method of making such a structure. It also describes one or several semiconductor devices made from such a semiconductor structure, for example transistors such as High Electron Mobility Transistors (HEMT), or light emitting diodes, for example including one of several semiconductor quantum wells.

Among the different existing semiconductors, semiconductors of group III-V or II-VI with a cubic or hexagonal crystal lattice structure, and particularly GaN, are interesting for making high quality electronic devices. In order to obtain GaN at a reasonable cost, GaN can be grown by heteroepitaxy on a substrate with a different nature such as a silicon or sapphire substrate.

However the lattice parameters and coefficients of thermal expansion (CTE) of these materials such as silicon and sapphire are different from those of GaN. Thus, epitaxial growth of GaN directly on a silicon or sapphire substrate generates important crystalline defects in GaN such as dislocations.

To prevent the appearance of these defects during growth of GaN, the first prerequisite step is to grow a buffer layer on the substrate on which GaN is then made, this buffer layer acting as a nucleation layer for GaN and making it possible to modify the stress in GaN. For example, such a buffer layer could be a layer of AlN that can reduce the difference between the lattice parameters of GaN and of the substrate material. However, with a single AlN buffer layer, the thickness of good quality GaN that can be obtained is very limited.

To grow a thick layer of good quality GaN on silicon, it is important that GaN should not be in direct contact with silicon and that GaN is formed with a compressive stress such that the GaN layer does not crack due to the difference in the coefficients of thermal expansion of GaN and silicon, during cooling after epitaxy of GaN. Considering that dislocations in the layers enable some relaxation, a reduction in the density of dislocations in the GaN layer can maintain compression for a longer time. Similarly, if layers are made successively by growth so that GaN can be put in compression, this resets stress states in GaN to zero, and the curvature of the wafer is then zero at ambient temperature.

Document US 2002/0074552 A1 describes how GaN can be grown on a silicon substrate through the use of a buffer structure including a first AlN layer and an AlGaN layer in which the gallium ratio increases gradually with its thickness, continuously or in steps. This type of buffer layer of AlGaN for which the gallium composition varies with its thickness makes it possible to put the GaN into compression. However, the reduction in the number of dislocations in the GaN formed on such a buffer layer is not sufficient, nor is the tension that can be obtained and maintained with such a material sufficient.

Document US 2002/0074552 A1 and document US 2012/0223328 A1 also describe the use of a buffer structure formed from an alternation of AlGaN layers in which the gallium ratio is different in different layers. Such a buffer structure is also called a superlattice.

The purpose of this structure is to make a relaxed layer grow with a small lattice parameter (for example AlN) on a thickness of a few nanometres, and then to make a layer in compression on a thickness of a few tens of nanometres with a larger lattice parameter.

Such a superlattice can give better tension strength for a resistive layer, but cannot sufficiently reduce the content of dislocations in the final layer of GaN.

The problems described above for GaN also occur during growth of other Group III-V or II-VI semiconductors comprising a cubic or hexagonal crystal lattice structure, on a substrate for which the lattice parameter is different from the lattice parameter of the semiconductor formed by growth.

PRESENTATION OF THE INVENTION

One purpose of this invention is to disclose a semiconductor structure comprising a Group III-V or II-VI semiconductor layer and comprising a cubic or hexagonal crystal lattice structure on a substrate comprising a material with a lattice parameter different from the lattice parameter of the semiconductor, and for which the compromise between the quality of the semiconductor/stress/voltage withstand is better than what can be obtained with semiconductor structures according to prior art.

In general, this document describes a semiconductor structure comprising at least:
  a substrate,
  a first Group III-V or II-VI semiconductor layer and comprising a cubic or hexagonal crystal lattice structure, placed on the substrate such that the lattice parameter of the said semiconductor is different from the lattice parameter of the substrate material,
  a first stack of several second and third layers arranged alternately one in contact with the other, between the substrate and the first layer, and comprising said semiconductor,
  and in which:
  the ratio of a semiconductor element in the second layers varies and increases from one second layer to the next along a direction from the substrate to the first layer,
  the ratio of said semiconductor element in the third layers varies and decreases from one third layer to the next along said direction such that a value of an average lattice parameter of each group of adjacent second and third layers is approximately constant in the first stack in the case of a cubic crystal lattice structure, or in the case of a hexagonal crystal lattice structure, the ratio of said semiconductor element of the third layers is approximately constant or varies so as to decrease from one third layer to the next along said direction such that the value of the average lattice parameter of each group of adjacent second and third layers increases from one group to the next in the first stack along said direction,
  the thickness of each of the second and third layers is less than about 5 nm.

The invention discloses a means of solving the technical problem mentioned above, corresponding to a semiconductor structure comprising at least:
  a substrate,
  a first semiconductor layer corresponding to $Al_XGa_YIn_{(1-X-Y)}N$, where $0 \leq X < 1$, $0 < Y \leq 1$ and $(X+Y) \leq 1$, arranged on the substrate and such that the lattice parameter of said semiconductor is not the same as the lattice parameter of the material of the substrate, first and second stacks composed of several second and third layers arranged alternately on each other and comprising said semiconductor, the first stack being located between the substrate and the first layer, and the second stack being located between the first stack and the first layer, a fourth semiconductor layer with approximately the same composition as the semiconductor in the first layer and located between the first and the second stacks, a relaxation layer comprising AlN and located between the fourth layer and the second stack, and in which, in each of the first and the second stacks:

the ratio of Ga in the semiconductor in the second layers varies and increases from one second layer to the next along a direction from the substrate to the first layer, the ratio of Ga in the semiconductor in the third layers is approximately constant or varies decreasing from one third layer to the next along said direction such that the average lattice parameter of each group of a second layer and an adjacent third layer increases from one group to the next in the first stack along said direction, the thickness of each of the second and third layers is less than about 5 nm.

Like superlattices according to prior art, the first and second stacks of such a semiconductor structure comprise a large number of interfaces between layers with different compositions, which can reduce the density of dislocations forming within the structure. Furthermore, the average value of the lattice parameter within the first and second stacks increases, or remains constant, so that good compression can be maintained in the materials comprising a hexagonal crystal lattice structure, avoiding stress in materials comprising a cubic crystal lattice structure.

The first and second stacks in the second and third layers included in this semiconductor structure make it possible to obtain a first layer with better quality than structures according to prior art for equivalent thickness, while maintaining a good compression stress within the different layers of the structure. Similarly, for a given semiconductor quality (quality of the semiconductor in the first layer), this structure makes it possible to have a thicker first semiconductor layer than would be possible with structures according to prior art.

Furthermore, unlike buffer layers used according to prior art and for the same final semiconductor quality obtained (semiconductor in the first layer), the total thickness of the layers between the substrate and the first layer can be less than the thickness of buffer layers according to prior art, for the same electrical performances, which results in a gain on the size, and a manufacturing cost lower than the manufacturing cost of structures according to prior art. Furthermore, due to the fact that an increase in the total thickness of the layers formed on the substrate makes the wafers weaker, this reduction in thickness can make the wafers produced more robust.

The ratio of a semiconductor element in the second layers, in other words the gallium ratio of the semiconductor in the second layers in the case of the invention, varies and increases from one second layer to the next along a direction from the substrate to the first layer. In other words, considering two second layers within the first stack, the ratio of this element in the one of these two second layers that is closest to the substrate is lower than the ratio of this element in the other of these two second layers.

In the case of a cubic crystal lattice structure of the semiconductor, the ratio of this semiconductor element in the third layers varies decreasing from one third layer to the next along a direction from the first layer to the substrate. In other words, considering two third layers within the first stack, the ratio of this element in the one of these two third layers that is closest to the first layer is higher than the ratio of this element in the other of these two third layers.

In the case of a hexagonal crystal lattice structure of the semiconductor, the ratio of this semiconductor element in the third layers is approximately constant in all the third layers. This configuration provides a means of adding a compression stress without generating dislocations because there is no slip plane in such a semiconductor, except parallel to growth in the <0001> direction. In particular, this compression stress can compensate for the difference in coefficients of thermal expansion between the materials, for example between GaN and silicon, during cooling after growth.

A group III-V semiconductor is a semiconductor comprising one or several elements which belong to column III A, or 13, and one or several elements which belong to column V A, or 15, in the periodic table, or Mendeleev's Table.

A group II-VI semiconductor is a semiconductor comprising one or several elements which belong to column II B, or 12, and one or several elements which belong to column VI A, or 16, in the Periodic Table.

The thickness of each of the second and third layers may be less than a critical thickness beyond which a relaxation phenomenon occurs and that results in the formation of dislocations and interface states. This is particularly the case when making the second and third layers with a thickness of less than about 5 nm. By avoiding such relaxation in the layers, an effect corresponding to a stress that increases continuously in a controlled manner is obtained.

By interposing several stacks between the first layer and the substrate, each forming a superlattice, many interfaces of different materials are interposed between the first layer and the substrate, which increases the total thickness of the semiconductor structure without weakening it. In this configuration, the second stack of second and third semiconductor layers located on the fourth semiconductor layer makes it possible to apply a compressive stress on this fourth semiconductor layer and finally to obtain a thicker structure provided with a thicker first layer at its summit, for example that is compatible with making a transistor capable of resisting electrical voltages with higher values than a thinner layer of the same semiconductor. Therefore, electrically, this configuration with very many interfaces can improve the voltage withstand of an electrical and/or electronic device made from such a semiconductor structure, while reducing current leaks within this structure.

Furthermore, the AlN relaxation layer located between the fourth layer and the second stack makes it possible to relax stresses on the lattice parameter between the fourth layer and the second stack, thus facilitating growth of the superlattice corresponding to the second stack on the relaxation layer, and further reducing leakage currents within the structure due to the improved efficiency of the interfaces.

The second stack may or may not be similar to the first stack.

The semiconductor structure may be such that it comprises:

n second stacks of several second and third layers arranged alternately one above the other and including said semiconductor, located between the first stack and the first layer, n fourth semiconductor layers with a composition very similar to the composition of the semiconductor of the first layer and such that one of the fourth layers is located on and in contact with the first stack, and in that the or each of the other fourth layers is located on and adjacent to one of the other second stacks, several relaxation layers comprising AlN and each located between one of the fourth layers and one of the second stacks, where n is an integer number between 2 and 19.

By thus multiplying the number of stacks and therefore the number of superlattices within the semiconductor structure, leakage currents in the semiconductor structure are lower so that the value of the breakdown voltage of an electrical/electronic device that comprises such a semiconductor structure can be increased.

The second stacks may or may not be similar to each other.

The semiconductor may be $Al_XGa_YIn_{(1-X-Y)}N$, where $0 \leq X < 1$, $0 < Y \leq 1$ and $(X+Y) \leq 1$. This type of semiconductor is a III-V type semiconductor with a hexagonal crystal lattice structure.

The thickness of the fourth layer or of each fourth layers may be between about 0.5 and 1.5 times the thickness of the stack on and in contact with which the fourth layer is located.

The semiconductor in the first layer may be GaN, and/or the semiconductor in the second layers may be $Al_XGa_{(1-X)}N$ (which corresponds to $Al_XGa_YIn_{(1-X-Y)}N$ in which X+Y=1), and/or the semiconductor in the third layers may be GaN.

In each of the first and second stacks, the semiconductor in the second layers may be $Al_XGa_{(1-X)}N$ such that X varies from about 1 to about 0.3 from one second layer to the next along a direction from the substrate to the first layer.

In one or several of the first and second stacks, fifth layers comprising AlN or AlGaN with a composition different from the composition of the semiconductor in the second and third layers may be arranged between groups of layers each formed from a second and a third layer. Thus, in this or these stacks, such a fifth layer of AlN or AlGaN can be arranged between two groups of layers each comprising a second and a third layer. Each of the fifth layers can be located on a third layer of one of these groups of layers. These additional interfaces between AlN or AlGaN in the fifth layers and the semiconductor in the third layers, for example made of GaN, further reduce leakage currents in stacks.

The semiconductor structure may also comprise a first buffer layer comprising AlN located between the substrate and the first stack.

Advantageously, the thickness of each of the second and third layers may be less than about 2 nm.

The thicknesses of all of the second layers may be similar and/or the thicknesses of all of the third layers may be similar.

The substrate may include monocrystalline silicon.

The total thickness of the first stack and/or the total thickness of the second stack or each second stack may be less than or equal to about 5 µm.

The semiconductor structure may also include at least:

a second stack of several second and third layers arranged alternately each in contact with the next and similar to the second and third layers in the first stack, located between the first stack and the first layer, a fourth semiconductor layer with approximately the same composition as the semiconductor in the first layer and located between the first and the second stacks, The invention also relates to a method of making a semiconductor structure as defined above, in which at least the first, second, third and fourth layers and the relaxation layer are made by molecular beam epitaxy or by vapour phase epitaxy.

The invention also relates to a semiconductor device comprising at least one semiconductor structure as defined above and an active zone or region comprising the first layer of the semiconductor structure or located on the first layer of the semiconducting structure.

Said semiconductor device may comprise at least one light emitting diode and/or at least one transistor including the active zone.

BRIEF DESCRIPTION OF THE DRAWINGS

This invention will be better understood after reading the description of example embodiments given purely for information and that are in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Figure 1:
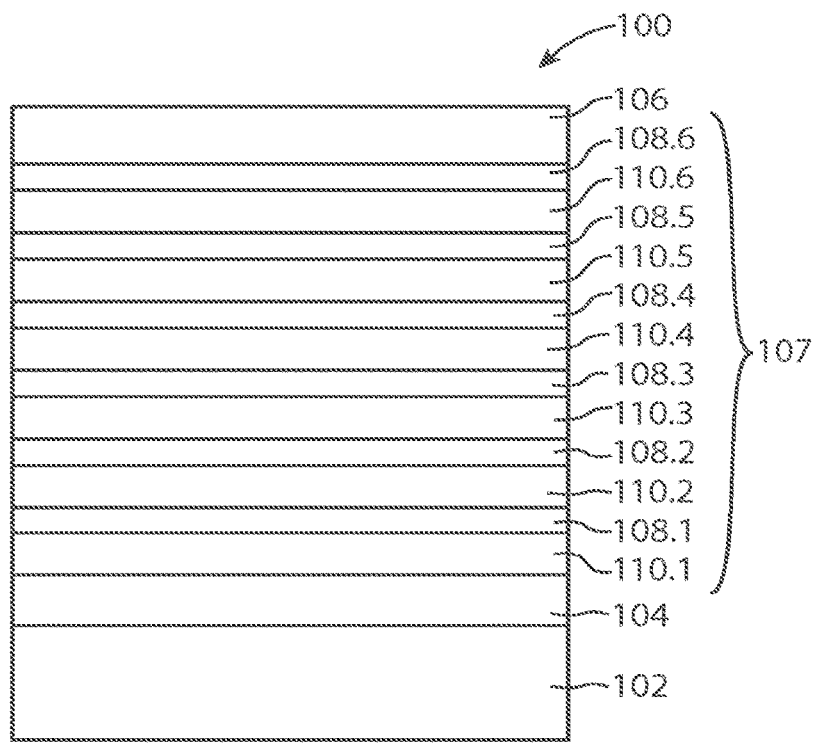
FIG. 1 shows a semiconductor structure according to a first example embodiment.

Refer firstly to FIG. 1 that shows a first embodiment of a semiconductor structure 100.

The structure 100 comprises a substrate 102 starting from which the other semiconductor layers of the structure 100 are made. In this first example embodiment, the substrate 102 comprises monocrystalline silicon of type (111) with a thickness equal to several microns or several tens or hundreds of microns. As a variant, the substrate 102 may comprise other materials for example such as sapphire or SiC.

A buffer layer 104 is located on the substrate 102 and acts as a nucleation layer for the growth of other semiconductor layers of the structure 100. For example, the buffer layer 104 comprises AlN and its thickness may be between about 5 nm and 1 µm, for example equal to about 200 nm. Another purpose of this buffer layer 104 is to protect the substrate 102 from the high temperatures involved to make other semiconductor layers of the structure 100.

The structure 100 also comprises a first semiconductor layer 106 located at the summit of the structure 100. This first layer 106 comprises the semiconductor that will be used to make active zones or regions of semiconductor devices. The semiconductor in the first layer 106 corresponds to a group III-V or II-VI semiconductor that comprises a cubic or hexagonal crystal lattice structure. The semiconductor in the first layer 106 is advantageously GaN that is a III-V semiconductor with a hexagonal crystal lattice structure. As a variant, the semiconductor in the first layer 106 may for example correspond to AlGaN or AlGaInN that are also III-V semiconductors with hexagonal crystal lattice structures. According to another variant, the first layer 106 may comprise a III-V semiconductor with a cubic crystal lattice structure, for example such as GaAs or InP. According to another variant, the first layer 106 may comprise a II-VI semiconductor with a hexagonal crystal lattice structure, for example such as ZnO, or a cubic crystal lattice structure, for example such as ZnS or ZnSe.

The thickness of the first layer 106 is chosen as a function of the future use of the semiconductor in this layer 106. Thus, when the first layer 106 will be used to make active zones of HEMT type transistors and to resist voltages of several hundred volts, the thickness of the first layer 106 may for example by equal to about 2 µm. In general, the thickness of the first layer 106 may be between about 100 nm and 5 µm.

Since the lattice parameter of the material of the substrate 102 is different from the lattice parameter of the semiconductor in the first layer 106, and so that the first layer 106 can be made such that the semiconductor in this layer is good quality, sufficiently stressed in compression, sufficiently thick and capable of providing a good voltage withstand, an alternating stack of second semiconductor layers 108 and third semiconductor layers 110 is made beforehand on the substrate 102, the first layer 106 being located on this stack of layers 108, 110. This stack is marked reference 107 on FIG. 1.

The thickness of each layer 108, 110 in this case is between about 0.5 nm, in other words the thickness of two monolayers, and 5 nm. Preferably, the thickness of each of the layers 108, 110 is less than or equal to about 2 nm, or even less than or equal to about 1 nm. The thicknesses of the second layers 108 can all be similar as is the case in FIG. 1, or they can be at least partly different from each other. The thicknesses of the third layers 110 can all be similar as is the case in FIG. 1, or they can be at least partly different from each other. Finally, the thicknesses of the second layers 108 can be similar to or different from (case in FIG. 1) the thicknesses of the third layers 110. The thickness of each layer 108, 110 is less than its critical thickness beyond which relaxation occurs that can cause the formation of dislocations in the material or interface states at interfaces with the other layers. This critical thickness depends on the nature of the semiconductor in these layers. For example, for AlN located on GaN, GaN starts to relax from a thickness equal to about 2 nm.

In the example in FIG. 1, only six second layers 108, references 108.1 to 108.6, and six third layers 110, references 110.1 to 110.6, are shown. However, the structure 100 usually comprises a much larger total number of layers 108, 110 than the example in FIG. 1, for example about 500 or more generally between about 150 and 2000. The total number of layers 108, 110 in the stack 107 is chosen particularly as a function of the thicknesses chosen for these layers and the required total thickness for this stack 107 of layers (which itself depends on the required thickness for the first layer 106) that is usually less than or equal to about 5 µm.

In this first example embodiment, the third layers 110 comprise GaN and the second layers 108 comprise $Al_XGa_{(1-X)}N$ in which the gallium ratio (1−X) varies from one second layer 108 to the next. The gallium ratio varies from one layer 108 to the next, increasing in the direction from the substrate 102 to the first layer 106. Thus, the gallium ratio of the second layer 108 that is closest to the substrate 102 (the layer 108.1 in the example in FIG. 1) may be close to zero, for example between 0 and 0.2. The gallium ratio of the second layer 108 that is closest to the first layer 106 (the layer 108.6 in the example in FIG. 1) may be between about 0.6 and 0.1, for example equal to 0.5. Typically, the gallium ratio of average compositions of the two final layers (layers 110.6 and 108.6 in the example in FIG. 1) is chosen to be more than about 0.2 to be sure that the layer 106 is compressed. In general, considering two second layers 108 within the stack 107, the gallium ratio in the one of these two second layers 108 that is closest to the substrate 102 is lower than the gallium ratio in the other of these two second layers 108.

The gallium ratio in the semiconductor in the third layers 110 is approximately constant (in this case equal to 1).

Since GaN in layers 106 and 110 corresponds to $Al_XGa_YIn_{(1-X-Y)}N$, where X=0 and Y=1, and since AlGaN in layers 108 corresponds to $Al_XGa_YIn_{(1-X-Y)}N$, where X+Y=1, each of the layers 106, 108, 110 comprises a semiconductor with a similar nature corresponding to $Al_XGa_YIn_{(1-X-Y)}N$, this semiconductor being of type III-V with a hexagonal crystal lattice structure.

Figure 2:
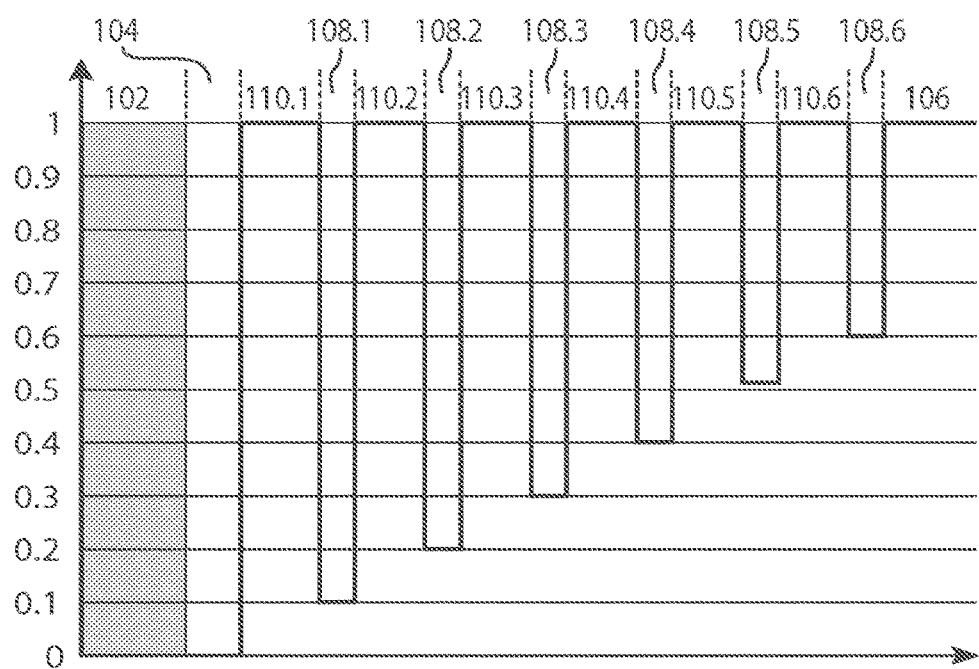
FIG. 2 shows a variation of the gallium ratio in the semiconductor in the layers of a first example embodiment of the semiconductor structure.

FIG. 2 shows the variation of the gallium ratio in the semiconductor in the different layers of the structure 100. This gallium ratio is zero in the substrate 102 and in the buffer layer 104, and is equal to 1 in each of the third layers 110 and in the first layer 106. The gallium ratio in the second layers 108 increases regularly in the direction from the substrate 102 to the first layer 106, from layer to layer (increase of 0.1 above the previous second layer in this example). Thus, the value of the average lattice parameter of each group formed from one of the second layers 108 and one of the third layers 110 adjacent to each other, increases from the substrate 102 to the first layer 106. Furthermore, since the composition of the semiconductor in the second layers 108 varies from one layer to the next, the stress also changes along the length of the stack 107 of layers 108, 110. The combination of these characteristics of the stack 107 of layers 108 and 110 can reduce the number of dislocations appearing in the first layer 106 while maintaining a good compressive stress in this layer 106 for a relatively high thickness. This structure also give a good voltage withstand.

As a variant to this first example, it is possible that the gallium ratio in the third layers 110 reduces regularly from one layer to the next, along the direction from the substrate 102 to the first layer 106. However, this reduction in the gallium ratio from one third layer 110 to the next is lower than the increase in the gallium ratio in the second layers 108 along this same direction such that the value of the average mesh parameter of each group composed of one of the second layers 108 and one of the third layers 110 adjacent to each other increases from the substrate 102 to the first layer 106. This variation in the composition of the material in the third layers 110 contributes to the change in stress along the stack of layers 108 and 110. As before, the combination of these characteristics of the stack 107 of layers 108 and 110 can reduce the number of dislocations appearing in the first layer 106 while maintaining a good level of compressive stress in this layer 106, for a relatively high thickness. This structure also give a good voltage withstand.

In the cases described above, the variation in the composition of the second layers 108 and/or the variation in the composition of the third layers 110, and therefore the variation of the average lattice parameter of each group composed of one of the second layers 108 and one of the third layers 110 adjacent to each other, may or may not be linear.

In a second example embodiment, the semiconductor in layers 106, 108 and 110 can correspond to a group III-V or II-VI semiconductor that comprises a cubic crystal lattice structure. For example, one such semiconductor is $Al_xGa_{1-x}As$. In this case, the buffer layer 104 comprises for example AlAs or GaAs, the first layer 106 comprises GaAs, and the second and third layers 108 and 110 comprise AlGaAs in which the gallium ratio varies from layer to layer both for the second layers 108 and for the third layers 110. Since the semiconductor in layers 106, 108, 110 comprises a cubic crystal lattice structure, the stack of layers 108 and 110 is made such that the gallium ratio varies within the layers 108 and 110 and such that the value of the average lattice parameter of each group of a second layer and an adjacent third layer is approximately constant over the entire thickness of the stack of layers 108 and 110.

Figure 3:
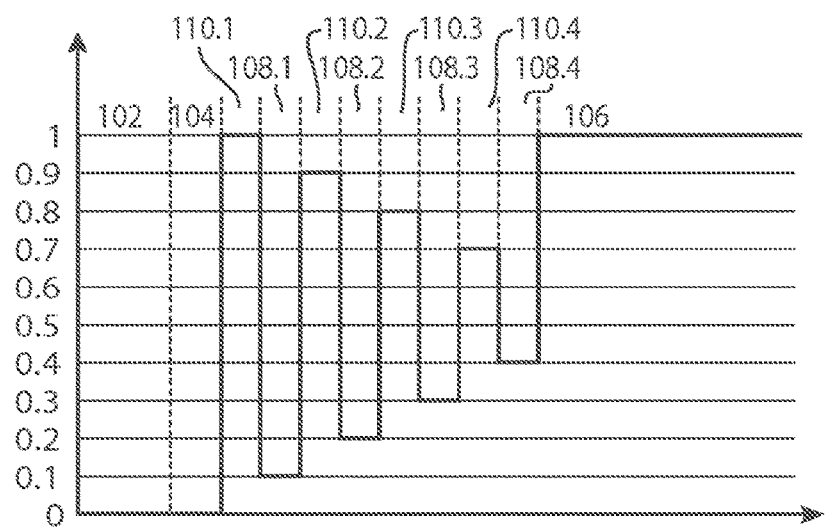
FIG. 3 shows a variation of the gallium ratio in the semiconductor in the layers of a second example embodiment of a semiconductor structure.

FIG. 3 shows an example variation of the gallium ratio in the semiconductor in the different layers of the structure 100 according to this second embodiment, in which the stack of layers 108, 110 comprises four second layers 108.1 to 108.4 and four third layers 110.1 to 110.4. It can be seen on this figure that the gallium ratio in the second layers 108 increases regularly layer after layer along the direction from the substrate 102 to the first layer 106 (for each second layer 108, an increase of 0.1 above the value for the previous second layer 108 in this example), and that at the same time, along the same direction, the gallium ratio in the third layers 110 reduces regularly and in proportion to the increase of gallium in the second layers 108 (for each third layer, a reduction of 0.1 below the value for the previous third layer 110 in this example). Thus, the value of the average lattice parameter of each group formed from one of the second layers 108 and one of the adjacent third layers 110, is approximately constant from the substrate 102 to the first layer 106. It is also possible to obtain an approximately constant value of the average lattice parameters of each group formed from one of the second layers 108 and an adjacent third layer 110 between the substrate 108 and the first layer 106, while having variable compositions of the layers 108 and 110 so as to have a change in the stress along the stack of layers 108 and 110, by making the layers 108 and 110 such that the gallium ratio in the third layers 110 increases regularly from layer to layer along the direction from the substrate 102 to the first layer 106, and at the same time the gallium ratio in the second layers 108 decreases regularly in proportion to the increase in the gallium ratio in the third layers 110, along the same direction, layer after layer.

As in the first example embodiment, the variation in the composition of the second layers 108 and the variation in the composition of the third layers 110 may or may not be linear.

According to a first embodiment, the structure 100 is such that between the first layer 106 and the buffer layer 104, several stacks of layers 108, 110, similar to the stacks described above, are placed one above the other and separated from each other by fourth semiconductor layers with a composition similar to the composition of the semiconductor in the first layer 106.

Figure 4:
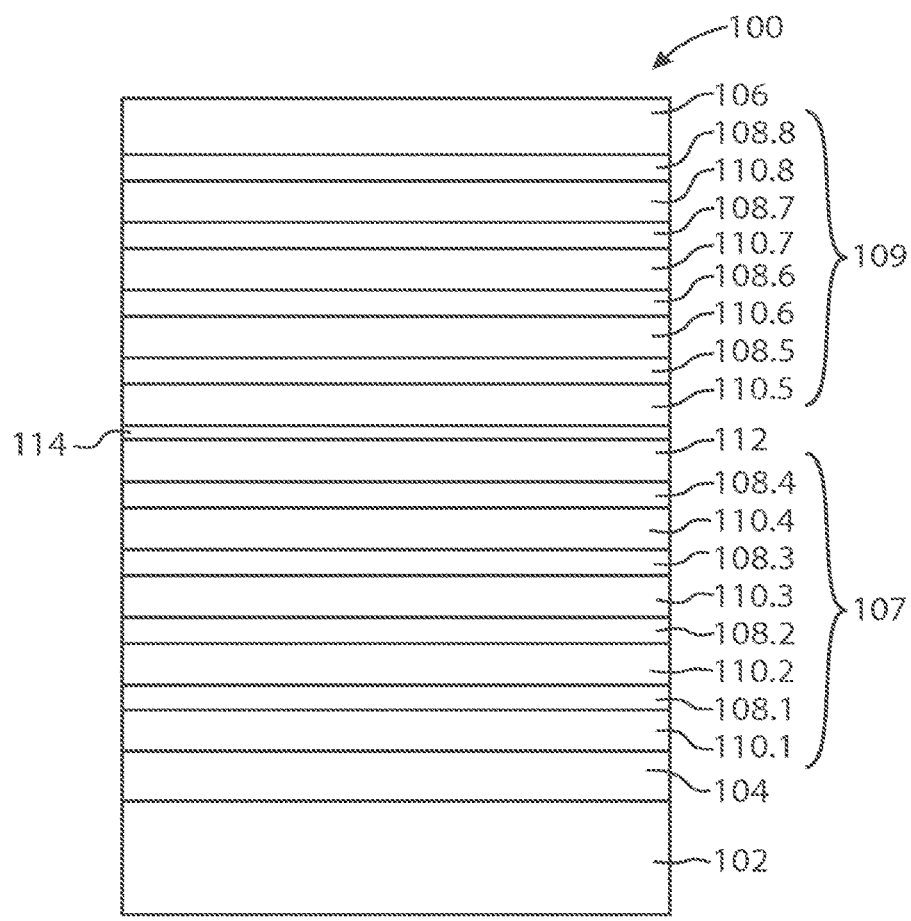
FIG. 4 shows a first embodiment of a semiconductor structure according to this invention.

FIG. 4 shows a semiconductor structure 100 according to this first embodiment. Thus, a first stack 107 of second layers 108.1 to 108.4 and third layers 110.1 to 110.4 of AlGaN for which the gallium compositions vary as described above with reference to FIG. 2 (only considering layers 110.1 to 110.4 and 108.1 to 108.4) is located on the buffer layer 104. A fourth layer 112 with composition similar to that of the first layer 106 (in this case GaN) is located on this first stack 107. A relaxation layer 114 comprising AlN is located on the fourth layer 112. The thickness of the relaxation layer 114 may for example be between about 5 nm and 50 nm, for example equal to about 15 nm. A second stack 109 of second layers 108.5 to 108.8 and third layers 110.5 to 110.8, in this case similar to the first stack 107, is placed on the relaxation layer 114. The first layer 106 is formed on this second stack 109.

The repetition of the stack of layers 108, 110 within the structure 100 makes it possible to apply a stress on the fourth layer 112 and thus to obtain a thicker semiconductor structure 100 so that a thicker first layer 106 can be obtained, for example to make a semiconductor device such as a transistor that can resist higher values of electrical voltages than is possible with a structure without this repetition of stacks of second and third layers 108, 110.

The insertion of the relaxation layer 114 between the fourth layer 112 and the second stack 109 makes it possible to relax constraints on the lattice parameter between the fourth layer 112 and the second stack 109, thus facilitating growth of the second stack 109 on the relaxation layer, and further reducing leakage currents within the structure 100.

Furthermore, as before, each stack 107, 109 of layers 108, 110 generally comprises a much larger number of layers that those shown on FIG. 4.

On FIG. 4, two stacks 107, 109 of layers 108, 110 separated from each other by the fourth layer 112 and the relaxation layer 114, are located between the substrate 102 and the first layer 106. However, it is quite possible that a larger number of stacks of layers 108, 110, in other words several second stacks 109 located between the first stack 107 and the first layer 106, and therefore also several fourth layers 112 and several relaxation layers 114 each interposed between two second stacks 109, are superposed and are located between the substrate 102 and the first layer 106.

In all cases, the first stack 107 and the second stacks 109 may or may not be similar to each other, particularly in terms of the number of second and third layers 108, 110, total thickness, Ga ratio in the second and third layers 108, 110, etc.

The thickness of each fourth layer 112 may be between about 0.5 and 1.5 times the thickness of the stack 107 or 109 on which the fourth layer 112 is supported.

Advantageously, the structure 100 may comprise between 1 and 19 second stacks 109.

Regardless of the embodiment or the variant embodiment, the different layers of the semiconductor structure 100 are produced by growth, particularly by molecular beam epitaxy or by vapour phase epitaxy. These growth steps can be implemented at low pressure, for example at about 75 mbars, at a temperature equal to about 1000° C. and under a partial pressure of ammonia equal to about 10 mbars for layers 108, 110. For example, for growth of layers with a nature similar to that of the layers in the first embodiment described above (comprising GaN), the layers may be grown at a pressure of between about 25 mbars and 1000 mbars and at a temperature of between about 900° C. and 1100° C. For a growth of layers with a nature similar to the that of the layers in the second embodiment (comprising GaAs), the layers may be grown at a pressure of between about 25 mbars and 1000 mbars and at a temperature of between about 500° C. and 700° C.

Figure 7:
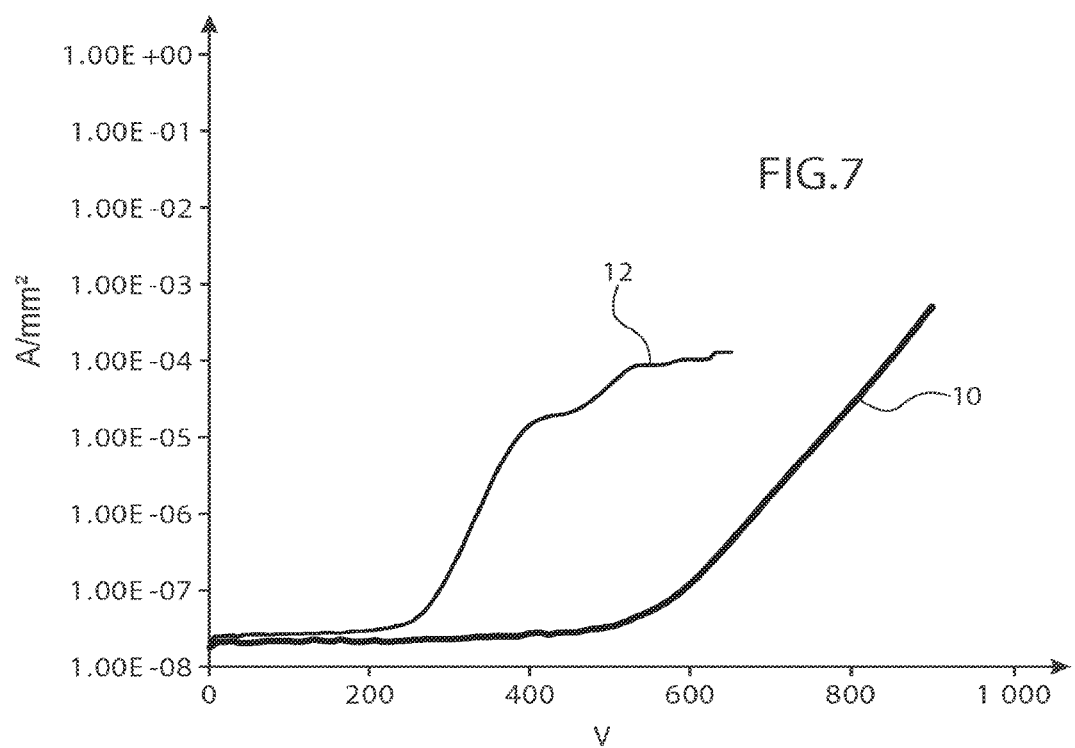
FIGS. 7 and 8 show leakage currents obtained in a semiconductor structure according to this invention.

Curve 10 shown on FIG. 7 represents leakage currents obtained up to the maximum breakdown voltage in a structure 100 like that previously described above with reference to FIG. 4, comprising several stacks 107, 109 composed of a total of 340 second and third layers 108, 110, the total thickness of the structure 100 being about 3.6 μm. For comparison, the curve 12 represents leakage currents obtained up to the final breakdown voltage in a structure with similar thickness but without the stacks 107, 109.

These curves show that the addition of stacks 107, 109 coupled with the fourth layers 112 and with the relaxation layers 114 can achieve a higher value of the breakdown voltage (gain of 250 V between curves 10 and 12), and lower leakage currents are obtained for a given voltage value (for example gain by a factor of 1000 at a voltage of 600 V).

Figure 8:
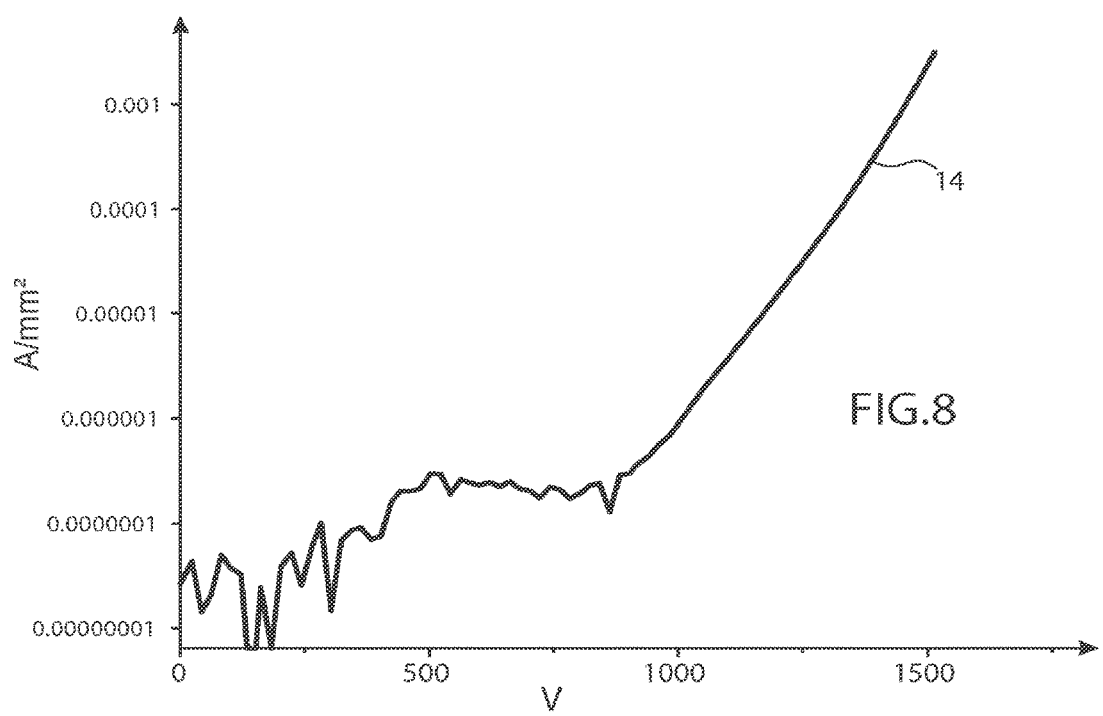

On FIG. 8, curve 14 represents the leakage currents obtained in a structure 100 like that described previously with reference to FIG. 4, but comprising a first stack 107 and two second stacks 109 (with three fourth layers 112 and two relaxation layers 114 located between the stack, the total thickness of the layers interposed between the substrate 102 and the first layer 106 being about 6.5 μm. It can be seen that the breakdown voltage of such a structure 100 is more than 1500 V and that low leakage currents, in this case less than about 5 μA/mm$^2$, are obtained for voltages of less than about 1200 V.

Figure 9:
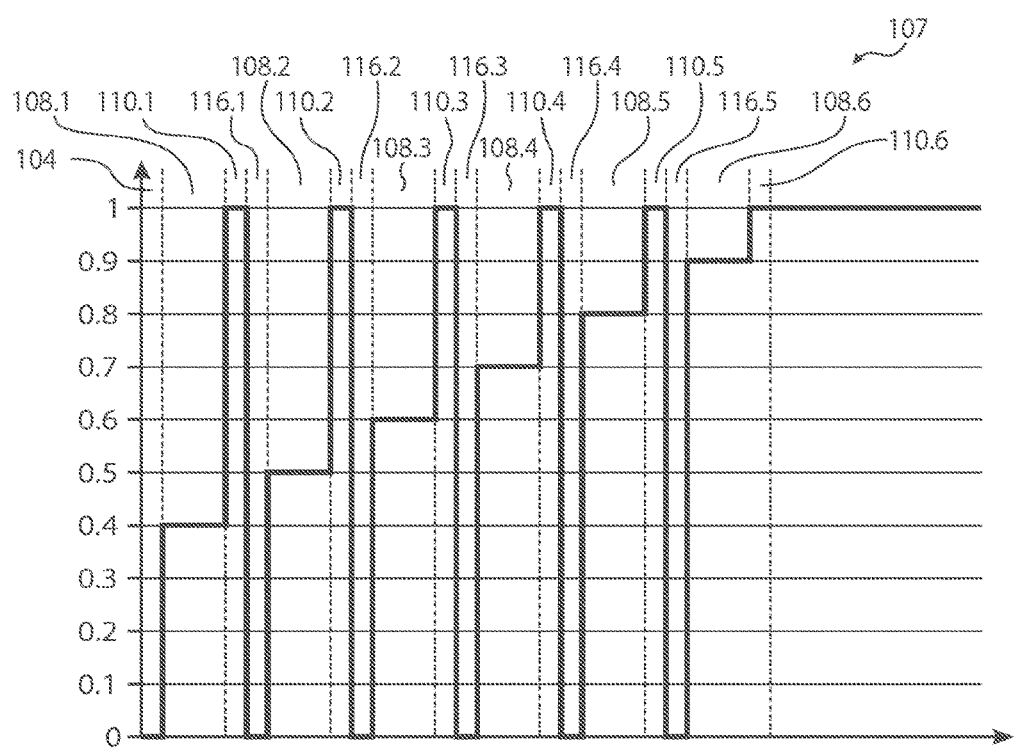
FIG. 9 shows a variation of the gallium ratio in the semiconductor in the layers of a stack of a semiconductor structure according to this invention, in one advantageous variant.

In one advantageous variant, it is possible that in one or several stacks 107, 109 of the structure 100, in addition to the second and third layers 108, 110, a fifth layer 116 of AlN or AlGaN with a different composition from the composition of the semiconductor in the second and third layers 108, 110 is inserted between each group composed of a second layer 108 and a third layer 110. FIG. 9 shows an example of the variation of the gallium ratio in the semiconductor in the different layers of one of the stacks of a structure 100 according to this advantageous variant, for example in this case the first stack 107. In this first stack 107 formed on the buffer layer 104, a first group of a second layer 108.1 and a third layer 110.1 is formed on the buffer layer 104. A fifth layer 116.1, in this case comprising AlN, is formed on the third layer 110.1. A second group of a second layer 108.2 and a third layer 110.2 is formed on the fifth layer 116.1. Another fifth layer 116.2, also comprising AlN, is formed on the third layer 110.2. This structure comprising a group of a second layer 108 and a third layer 110 and a fifth layer 116 is repeated several times to form the first stack 107. In this example, the gallium ratio in the six second layers 108.1 to 108.6 varies from one second layer to the next, from 0.4 to 0.9.

Inserting these fifth layers 116 comprising AlN or AlGaN into one or several stacks 107, 109, makes it easier to grow the materials of the layers. Furthermore, the interfaces formed between the third layers 110 made of GaN and the fifth layers made of AlN or AlGaN can further reduce leakage currents in this or these stacks.

Other layers can also be interposed within one or several stacks 107, 109, for example forming structures of three, four, five or even six repeated layers to form this or these stacks to facilitate growth of the different layers of the structure 100, to improve the voltage withstand and reduce leakage currents in the structure 100.

Figure 5:
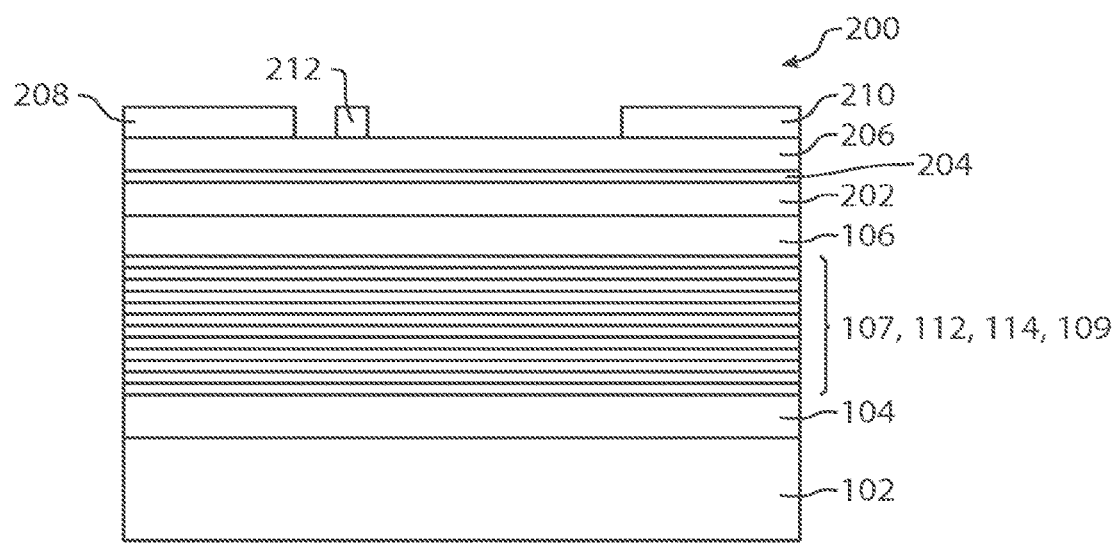
FIG. 5 diagrammatically shows a power transistor made on a particular embodiment of a semiconductor structure according to this invention.

The first layer 106 obtained can be used as active layer of the semiconductor devices made from the substrate formed by the structure 100. For example, an HEMT transistor 200 can be made from the first GaN layer 106, as shown diagrammatically on FIG. 5. This first layer 106 is doped, for example with carbon, for example with a concentration equal to about $10^{19}$ cm$^{-3}$. An additional layer 202 comprising a semiconductor similar to that in the first layer 106 and thinner than the first layer 106 (for example thickness equal to about 100 nm, or between about 25 nm and 1 μm), and also comprising carbon as doping agent with a concentration equal for example to about $5 \times 10^{16}$ cm$^{-3}$, is formed on the first layer 106. This additional layer 202 of GaN will form the channel of the HEMT transistor 200. A spacer layer 204, for example comprising AlN and with a thickness equal to about 1 nm, is then deposited on the additional layer 202 of GaN.

Finally, an AlGaN layer 206, for example with a gallium ratio equal to about 80% and capable of forming a two-dimensional electron gas in the transistor channel 200, is formed on this spacer layer 204. The HEMT transistor 200 is then completed using conventional steps such as the formation of source regions 208 and drain regions 210, metallic contacts, the gate 212, etc.

Figure 6:
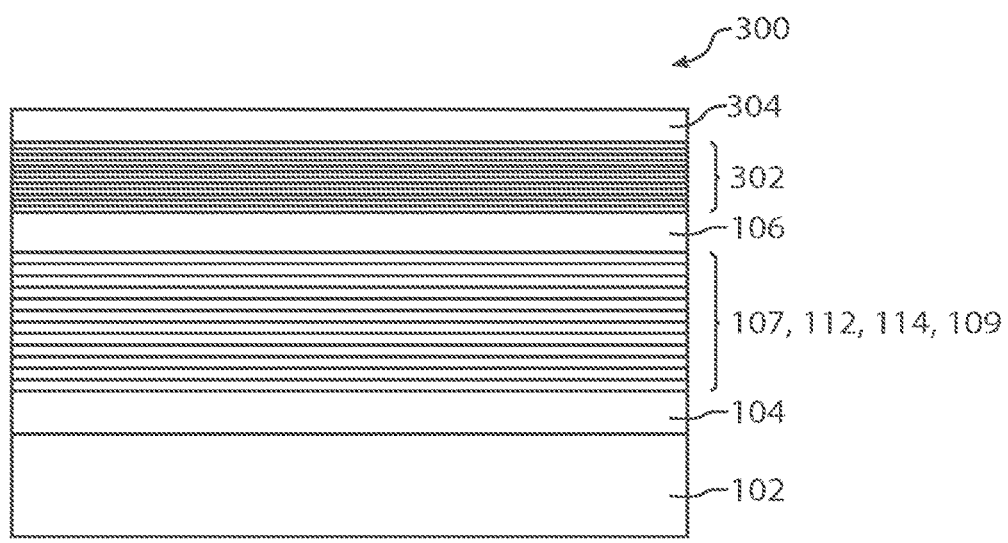
FIG. 6 diagrammatically shows a light emitting diode made on a particular embodiment of a semiconductor structure according to this invention.

The first layer 106 obtained can also be used as active layer for a light emitting diode 300 as shown for example on FIG. 6. In this case, the first GaN layer can be n doped. A quantum well structure 302 comprising GaN barrier layers and InGaN emitting layers is then formed on the first layer 106. A p doped GaN layer 304 can finally be made on the quantum well structure 302.

The invention claimed is:
1. A semiconductor structure comprising:
a substrate,
a first semiconductor layer, wherein a material of the substrate and a semiconductor of the first semiconductor layer are crystalline materials having in-plane lattice parameters and the first semiconductor layer is arranged on the substrate such that in-plane lattice parameters of the first semiconductor layer are not the same as in-plane lattice parameters of the material of the substrate,
first and second stacks each comprising a plurality of second and third layers, wherein the second and third layers are arranged such that within said first and second stack a pair of second layers sandwich at least one third layer and a pair of third layers sandwich at least one second layer and the plurality of second and third layers comprise a semiconductor, the first stack being located between the substrate and the first semiconductor layer, and the second stack being located between the first stack and the first semiconductor layer,
a fourth semiconductor layer with similar or approximately the same composition as the semiconductor in the first semiconductor layer and located between the first and the second stacks,
a relaxation layer consisting of AlN and located between the fourth semiconductor layer and the second stack,
wherein the semiconductors in the first semiconductor layer, the second layers, the third layers, and the fourth semiconductor layer has the formula Al$_x$Ga$_y$In$_{(1-x-y)}$N, where 0<X<1, 0<Y <1 and (X+Y) 1, and in each of the first and the second stacks:
the ratio of Ga in the semiconductor in the second layers varies and increases from one second layer to the next along a direction from the substrate to the first semiconductor layer,
the ratio of Ga in the semiconductor in the third layers is constant or varies and decreases from one third layer to the next along the direction from the substrate to the first semiconductor layer such that an average in-plane lattice parameter of each group of a second layer and an adjacent third layer increases from one group to the next in the first stack along said direction from the substrate to the first semiconductor layer,
the thickness of each of the second and third layers is less than about 5 nm, and each second layer is in direct contact with at least one of the third layers
wherein at least one of the following conditions is met: (i) each of the second layers comprises a uniform Ga content or (ii) except for the top most second layer, each second layer is in direct contact with two third layers on opposite sides of each of the second layers, and
wherein
the first stack is in physical or direct contact with the fourth semiconductor layer, or
the second stack is in physical or direct contact with the relaxation layer, or
the first stack is in physical or direct contact with the fourth semiconductor layer and the second stack is in physical or direct contact with the relaxation layer, or
the first stack is in direct contact with the fourth semiconductor layer, the fourth semiconductor layer is in direct contact with the relaxation layer, and the relaxation layer is in direct contact with the second stack.

2. The semiconductor structure according to claim 1, wherein the thickness of the fourth semiconductor layer is between about 0.5 and 1.5 times the thickness of the first stack.

3. The semiconductor structure according to claim 1, wherein the semiconductor in the first semiconductor layer is GaN, and/or the semiconductor in the second layers is $Al_xGa_{(1-x)}N$, and/or the semiconductor in the third layers is GaN.

4. The semiconductor structure according to claim 1, wherein, in each of the first and second stacks, the semiconductor in the second layers is $Al_xGa_{(1-x)}N$ such that X varies from about 1 to about 0.3 from one second layer to the next along the direction from the substrate to the first semiconductor layer.

5. The semiconductor structure according to claim 1, further comprising a first buffer layer comprising AlN and located between the substrate and the first stack.

6. The semiconductor structure according to claim 1, wherein the thickness of each of the second and third layers is less than about 2 nm.

7. The semiconductor structure according to claim 1, wherein the thicknesses of all of the second layers are similar and/or the thicknesses of all of the third layers are similar.

8. The semiconductor structure according to claim 1, wherein the substrate comprises monocrystalline silicon.

9. The semiconductor structure according to claim 1, wherein the total thickness of the first stack and/or the total thickness of the second stack is less than or equal to about 5 μm.

10. A method of making the semiconductor structure according to claim 1, comprising making at least the first semiconductor layer, the second layer, the third layer and the fourth semiconductor layer and the relaxation layer by molecular beam epitaxy or by vapor phase epitaxy.

11. A semiconductor device corresponding to a light emitting diode or a transistor, said semiconductor device comprising the semiconductor structure according to claim 1 and an active zone which includes the first semiconductor layer of the semiconductor structure located on the first semiconductor layer of the semiconducting structure.

12. The semiconductor structure according to claim 1, wherein each of the second layers comprises a uniform Ga content.

13. The semiconductor structure according to claim 1, wherein except for the top most second layer, each second layer is in direct contact with two third layers on opposite sides of each of the second layers.

14. The semiconductor structure according to claim 1, wherein each of the second layers comprises a uniform Ga content and except for the top most second layer, each second layer is in direct contact with two third layers on opposite sides of each of the second layers.

* * * * *